(12) United States Patent
Koyano et al.

(10) Patent No.: US 9,641,092 B2
(45) Date of Patent: May 2, 2017

(54) POWER CONVERTER

(75) Inventors: Hironori Koyano, Yamato (JP);
Takamasa Nakamura, Atsugi (JP);
Masao Saito, Tokyo (JP); Kouji Yamamoto, Chigasaki (JP); Tsutomu Matsukawa, Sagamihara (JP); Manabu Koshijo, Atsugi (JP); Junichi Itoh, Nagaoka (JP); Yoshiya Ohnuma, Nagaoka (JP)

(73) Assignees: NISSAN MOTOR CO., LTD., Yokohama-shi (JP); NAGAOKA UNIVERSITY OF TECHNOLOGY, Nagaoka-shi (JP)

( * ) Notice: Subject to any disclaimer, the term of this patent is extended or adjusted under 35 U.S.C. 154(b) by 0 days.

(21) Appl. No.: 14/122,260

(22) PCT Filed: May 7, 2012

(86) PCT No.: PCT/JP2012/061657
§ 371 (c)(1),
(2), (4) Date: Nov. 26, 2013

(87) PCT Pub. No.: WO2012/165102
PCT Pub. Date: Dec. 6, 2012

(65) Prior Publication Data
US 2014/0192578 A1    Jul. 10, 2014

(30) Foreign Application Priority Data
May 31, 2011    (JP) .................................. 2011-122843

(51) Int. Cl.
*H02M 5/293*    (2006.01)
*H02M 7/00*    (2006.01)
(Continued)

(52) U.S. Cl.
CPC .......... *H02M 5/293* (2013.01); *H02M 7/003* (2013.01); *H05K 7/1432* (2013.01); *H02M 1/4258* (2013.01); *Y02B 70/126* (2013.01)

(58) Field of Classification Search
CPC .... H02M 1/32; H02M 7/797; H02M 3/33584; H02M 5/271; H02M 5/4505; H02M 7/219; H02M 7/53803; H02M 7/5395
(Continued)

(56) References Cited

U.S. PATENT DOCUMENTS 4,363,065 A    12/1982  Hasegawa et al.
4,468,725 A     8/1984  Venturini
(Continued)

FOREIGN PATENT DOCUMENTS

EP    2 418 764 A2    2/2012
JP    01-231662 A     9/1989
(Continued)

OTHER PUBLICATIONS

U.S. Appl. No. 14/122,268, filed Nov. 26, 2013, Hironori Koyano et al.
(Continued)

*Primary Examiner* — Adolf Berhane
*Assistant Examiner* — Henry Lee, III
(74) *Attorney, Agent, or Firm* — Foley & Lardner LLP

(57) ABSTRACT

Provided is a power converter 3 that directly converts polyphase AC power to AC power. A converter circuit has a plurality of first switching elements 311, 313 and 315 that are connected to each phase R, S or T of the polyphase AC power to enable switching for turning on current-carrying bidirectionally, and a plurality of second switching elements 312, 314 and 316 that are connected to each phase to enable switching for turning on current-carrying bidirectionally. The converter circuit comprises input lines R, S and T
(Continued)

connected to each input terminal, and output lines P and N connected to each output terminal. Parts of wiring 347 and 348 of protection circuits 32 are located between output lines P and N. The wiring distance between each protection circuit 32 and the corresponding switching element can be shortened.

6 Claims, 13 Drawing Sheets

(51) Int. Cl.
*H05K 7/14* (2006.01)
*H02M 1/42* (2007.01)

(58) Field of Classification Search
USPC ..... 363/34, 36–37, 40, 50, 55, 56.01–56.05, 363/95, 109, 123–124, 131–132, 149
See application file for complete search history.

(56) References Cited

U.S. PATENT DOCUMENTS

| | | | |
|---|---|---|---|
| 4,833,584 | A | 5/1989 | Divan |
| 5,010,471 | A | 4/1991 | Klaassens et al. |
| 5,132,896 | A | 7/1992 | Nishizawa et al. |
| 5,287,260 | A | 2/1994 | Uchino |
| 5,430,639 | A | 7/1995 | Takahashi |
| 5,517,063 | A | 5/1996 | Schantz et al. |
| 5,946,178 | A * | 8/1999 | Bijlenga ............... H02M 7/538 361/91.5 |
| 6,266,258 | B1 * | 7/2001 | Babinski .................... 363/56.02 |
| 7,573,732 | B2 * | 8/2009 | Teichmann et al. ............ 363/51 |
| 7,768,149 | B2 | 8/2010 | Imai et al. |
| 7,869,193 | B2 | 1/2011 | Nohara et al. |
| 8,031,479 | B2 | 10/2011 | Nagashima et al. |
| 8,058,554 | B2 | 11/2011 | Nakamura et al. |
| 8,500,491 | B2 | 8/2013 | Suzuki |
| 8,964,387 | B2 | 2/2015 | Meinecke et al. |
| 2001/0046143 | A1 | 11/2001 | Bruckmann ....... H03K 17/0828 363/56.05 |
| 2002/0034087 | A1* | 3/2002 | Suzuki .................. H02M 7/003 363/144 |
| 2003/0174527 | A1 | 9/2003 | Bruckmann et al. |
| 2008/0013351 | A1 | 1/2008 | Alexander |
| 2008/0205093 | A1 | 8/2008 | Davies et al. |
| 2008/0315819 | A1 | 12/2008 | Ueda |
| 2009/0015992 | A1 | 1/2009 | Nohara et al. |
| 2009/0052134 | A1 | 2/2009 | Casteel et al. |
| 2011/0267862 | A1* | 11/2011 | Roesner et al. ............... 363/132 |
| 2012/0019970 | A1 | 1/2012 | Nagano et al. |
| 2012/0139483 | A1 | 6/2012 | Cottet |
| 2013/0155731 | A1 | 6/2013 | Reichard et al. |
| 2014/0085950 | A1 | 3/2014 | Koyano et al. |
| 2014/0085956 | A1 | 3/2014 | Koyano et al. |
| 2014/0104913 | A1 | 4/2014 | Koyano et al. |
| 2014/0126263 | A1 | 5/2014 | Koyano et al. |
| 2014/0192578 | A1 | 7/2014 | Koyano et al. |
| 2014/0247635 | A1 | 9/2014 | Koyano et al. |
| 2014/0247636 | A1 | 9/2014 | Koyano et al. |

FOREIGN PATENT DOCUMENTS

| | | |
|---|---|---|
| JP | 02-130955 A | 5/1990 |
| JP | 03-145929 A | 6/1991 |
| JP | 06-165524 A | 6/1994 |
| JP | 06-261556 A | 9/1994 |
| JP | 2001-045772 A | 2/2001 |
| JP | 2002-252535 A | 9/2002 |
| JP | 2005 065357 A | 3/2005 |
| JP | 2005-228205 A | 8/2005 |
| JP | 2005-237138 A | 9/2005 |
| JP | 2006-333590 A | 12/2006 |
| JP | 2009-213269 A | 9/2009 |
| JP | 2010-263702 A | 11/2010 |
| RU | 2225026 C2 | 2/2004 |
| WO | WO-00/08740 A2 | 2/2000 |

OTHER PUBLICATIONS

U.S. Appl. No. 14/122,413, filed Nov. 26, 2013, Hironori Koyano et al.
U.S. Appl. No. 14/122,388, filed Nov. 26, 2013, Hironori Koyano et al.
U.S. Appl. No. 14/122,259, filed Nov. 26, 2013, Hironori Koyano et al.
U.S. Appl. No. 14/122,397, filed Nov. 26, 2013, Hironori Koyano et al.
USPTO Office Action, U.S. Appl. No. 14/122,259, Jun. 12, 2015, 11 pages.
USPTO Office Action, U.S. Appl. No. 14/122,397, Jun. 4, 2015, 10 pages.
USPTO Office Action, U.S. Appl. No. 14/122,388, Jul. 20, 2015, 15 pages.
USPTO Office Action, U.S. Appl. No. 14/122,268, Mar. 4, 2016, 16 pages.
USPTO Notice of Allowance, U.S. Appl. No. 14/122,259, Apr. 12, 2016, 26 pages.
USPTO Office Action, U.S. Appl. No. 14/122,397, Dec. 18, 2015, 22 pages.
USPTO Office Action, U.S. Appl. No. 14/122,388, Jan. 15, 2016, 17 pages.
USPTO Office Action, U.S. Appl. No. 14/122,259, Oct. 8, 2015, 11 pages.
USPTO Office Action, U.S. Appl. No. 14/122,413, Sep. 29, 2015, 21 pages.
European Extended Search Report, Oct. 27, 2015, 8 pages.
USPTO Office Action, U.S. Appl. No. 14/122,413, Feb. 4, 2015 (including US 2008/0136265).
USPTO Advisory Action, U.S. Appl. No. 14/122,388, May 19, 2016, 10 pages.
USPTO Notice of Allowance, U.S. Appl. No. 14/122,268, Jul. 6, 2016, 7 pages.
USPTO Office Action, U.S. Appl. No. 14/122,413, Jul. 21, 2016, 16 pages.
USPTO Notice of Allowance, U.S. Appl. No. 14/122,413, Nov. 23, 2016, 10 pages.
USPTO Office Action, U.S. Appl. No. 14/122,397, Dec. 15, 2016, 13 pages.
USPTO Office Action, U.S. Appl. No. 14/122,388, Sep. 29, 2016, 21 pages.
USPTO Office Action, U.S. Appl. No. 14/122,397, Jun. 2, 2016, 17 pages.

\* cited by examiner

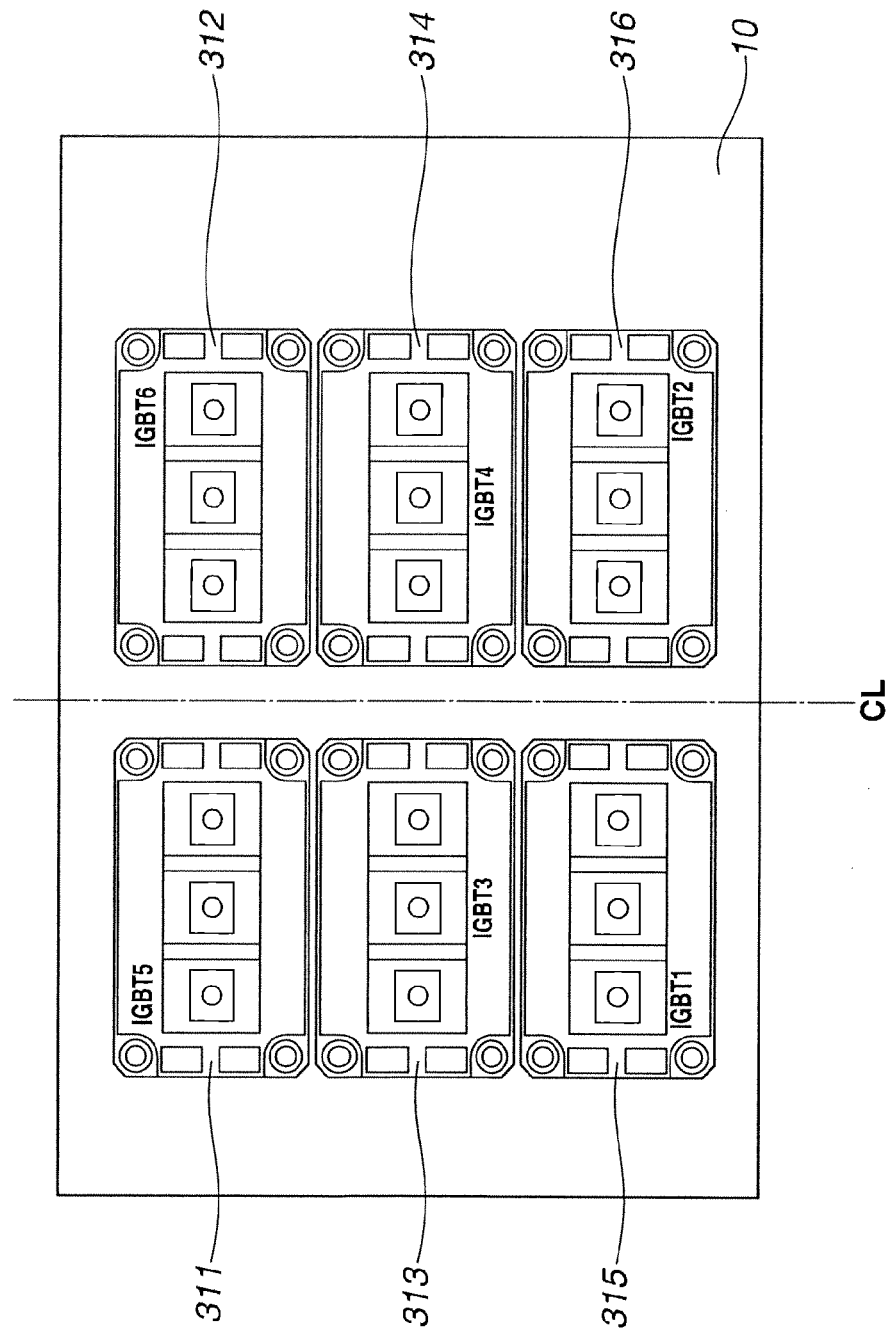

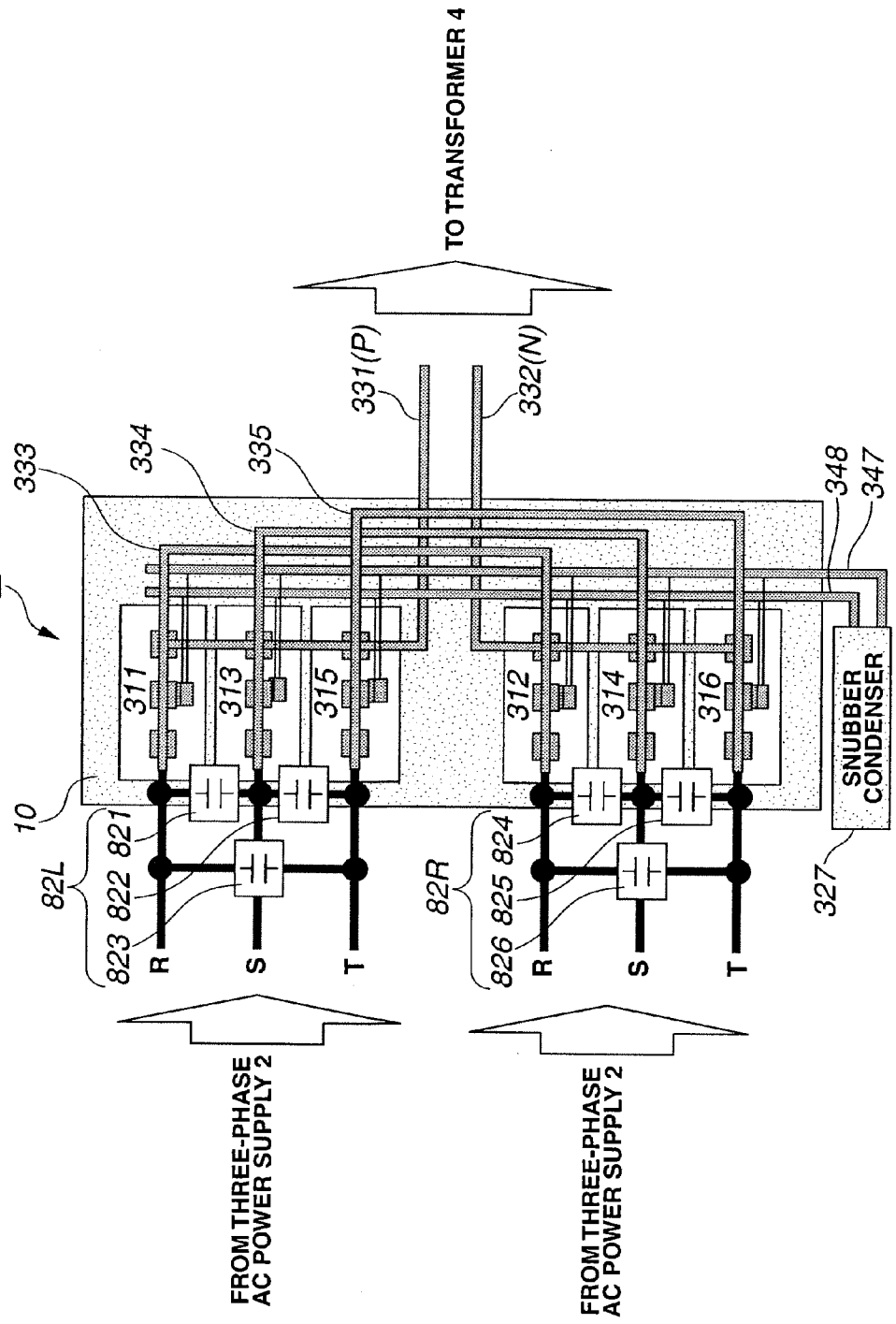

US 9,641,092 B2
// 1

POWER CONVERTER

TECHNICAL FIELD

The present invention relates to a power converter that directly converts AC power of commercial frequency to an arbitrary PC power.

BACKGROUND ART

As a power converter that has the small number of components to enable downsizing of the device and directly and effectively converts AC power to AC power, a matrix-converter has been known (Patent Document 1).

However, in the above-mentioned conventional matrix-converter, the wiring for connecting a snubber circuit, which is a protection circuit of a switching element, to the switching element has a long length undesirably.

PRIOR ART DOCUMENT

Patent Document

Patent Document 1: Japanese Laid-open Patent Application (Tokkai) 2006-333590

SUMMARY OF INVENTION

An object of the present invention is to provide a power converter that can shorten the wiring distance between the protection circuit and the switching element.

In the present invention, a part of the protection circuit of the switching element is located between output lines.

According to the present invention, since the output lines are drawn in one direction, the part of the protection circuit is permitted to form a line, and thus, the wiring distance between the protection circuit and the switching element can be shortened.

BRIEF DESCRIPTION OF DRAWINGS

FIG. 2A is a plan view of a power converter of the embodiment of the present invention in an assembling process.

FIG. 5 shows plan and side views depicting still another layout of IGBTs and filter condensers shown in FIG. 3.

EMBODIMENTS FOR CARRYING OUT INVENTION

Outline of Power Conversion System 1

Figure 1:
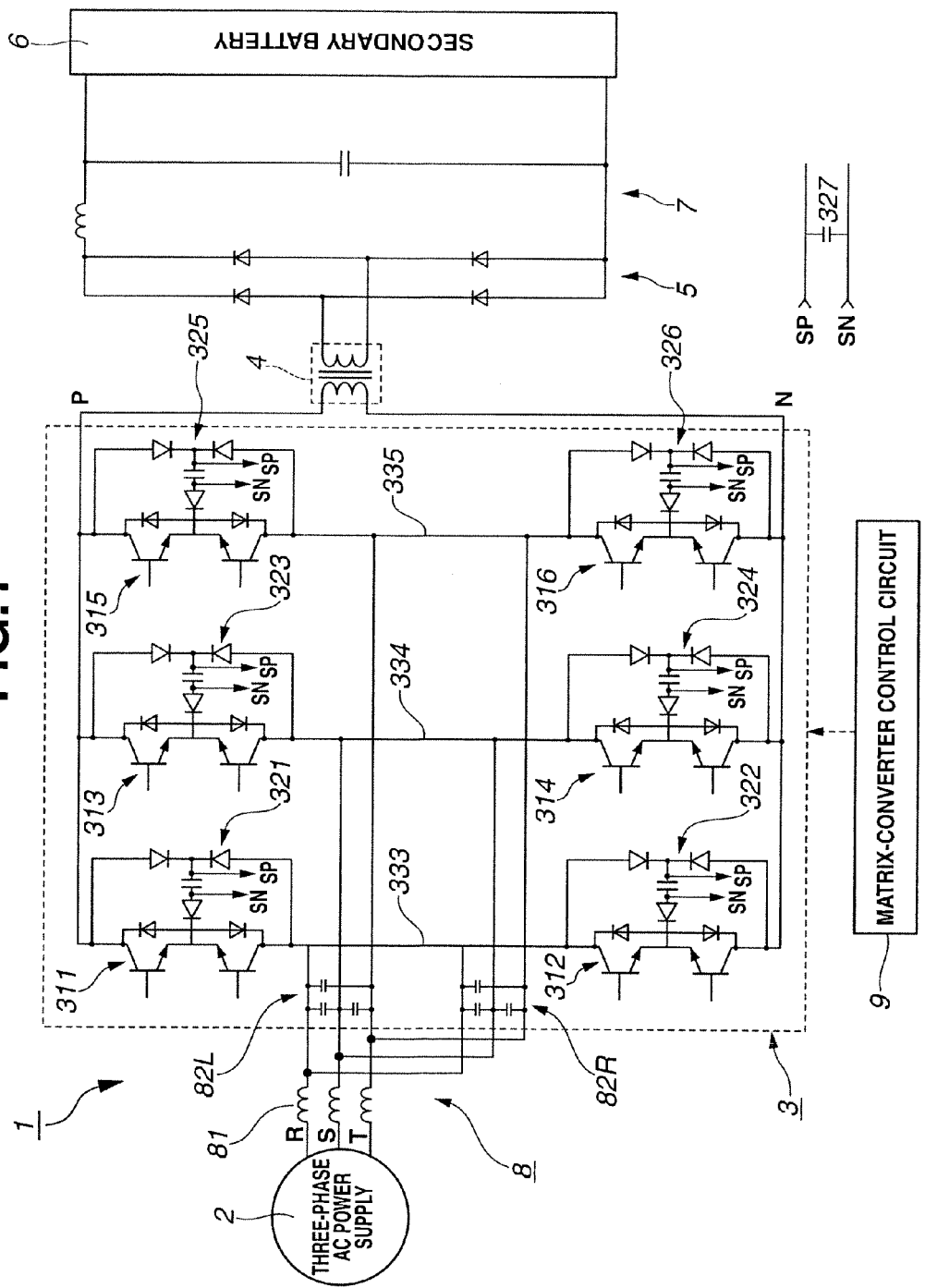
FIG. 1 is an electrical diagram showing a power conversion system to which an embodiment of the present invention is practically applied.

First, a brief outline of a power conversion system to which an embodiment of the present invention is practically applied will be described with reference to FIG. 1. The power conversion system 1 of this example is a system in which a three-phase AC power supplied from a three-phase AC power supply 2 is directly converted to a single-phase AC power by a power converter 3 of the embodiment of the present invention, and after the voltage of the converted AC power is stepped up or down by a transformer 4 to a suitable value, the transformed AC power is converted by a rectifier 5 to a DC power to charge a secondary battery 6. It is to be noted that denoted by numeral 7 is a smoothing circuit.

In power conversion system 1 of this example, output lines (indicated by R-phase, S-phase and T-phase) to which the three-phase AC power is supplied from three-phase AC power supply 2 have at each phase a filter circuit 8 that dampens a higher harmonic wave for suppressing noise. Filter circuit 8 of this example comprises three filter reactors 81 respectively connected to the R, S and T phases and six filter condensers 82L and 82R each being connected between the R, S and T phases. The layout of filter condensers 82L and 82R (which are indicated as filter condensers 821 to 836 in FIGS. 3 to 6) will be described hereinafter.

In power conversion system 1 of this example, the three-phase AC power is supplied to power converter 3 through filter circuit 8 and converted into the single-phase AC power. Power converter 3 of this example is equipped with six bidirectional switching elements 31 that are arranged in a matrix shape corresponding to the R, S and T-phases. In the following, when one bidirectional switching element is to be generically described, explanation will be made with the aid of reference numeral 31, while, as is shown in FIG. 1, when a specified one of the six bidirectional switching elements is to be described, explanation will be made by using reference numerals 311 to 316.

Each of bidirectional switching elements 31 of this example is constructed of an IGBT module in which IGBT (viz., Insulated Gate Bipolar Transistor), which is a semiconductor switching element, and reflux diodes are combined and connected through an inverse-parallel connection. It is to be noted that each of bidirectional switching elements 31 is not limited to the illustrated one. That is, the switching element may have the other construction. For example, the switching element may have a construction in which two elements of reverse-blocking type IGBT are connected through an inverse-parallel connection.

Each of bidirectional switching elements 31 is equipped with a snubber circuit 32 for protecting bidirectional switching element 31 from a surge voltage inevitably produced when bidirectional switching element 31 is subjected to ON/OFF operation, snubber circuit 32 including a combination of one snubber condenser and three diodes which are arranged at input and output sides of bidirectional switching element 31. In the following, when one snubber circuit is to be generally described, explanation will be made with the aid of reference numeral 32, while, as is shown in FIG. 1, when a specified one of the six snubber circuits is to be described, explanation will be made by using reference numerals 321 to 326.

Power conversion system 1 of this example is equipped with a matrix-converter control circuit 9 for effecting ON/OFF control of bidirectional switching elements 31 of power converter. In the matrix-converter control circuit 9, a value of voltage supplied from the three-phase AC power supply 2, a value of DC current that is being outputted and a target level of order current are inputted, and thereafter, based on them, respective gate signals of the bidirectional switching elements 31 are controlled to adjust the single-phase AC power directed to the transformer 4. With this, a target direct-current power is obtained.

Transformer 4 functions to step up or down the voltage of the single-phase AC power, which has been converted by power converter 3, to a desired value. Rectifier 5 is equipped with four rectifying diodes to convert the adjusted single-phase AC power to a direct-current power. Smoothing circuit 7 is equipped with a coil and a condenser for smoothing the pulsating current contained in the rectified direct current so that the pulsating current is smoothed to show a shape much similar to a direct current.

By power conversion system 1 having the above-mentioned construction, the three-phase AC power from three-phase AC power supply 2 is directly converted by power converter 3 to the single-phase AC power, and after the converted single-phase AC power is adjusted in voltage, the adjusted single-phase AC power is converted to the direct-current power. With this, secondary battery 6 is charged. It is to be noted that the above-mentioned power conversion system 1 is one of exemplified systems to which power converter 3 of the present invention is practically applied and the present invention is not limited to application to only the above-mentioned power conversion system 1. That is, when at least one of an electric power that is to be converted and an electric power that has been converted is a polyphase AC power, the present invention is applicable to other power conversion systems.

Part Arrangement of Power Converter 3

Then, spatial arrangement of parts that constitute power converter 3 of FIG. 1 will be described with reference to FIGS. 2 to 6. It is to be noted that parts identical to those shown in FIG. 1 are indicated by the same reference numerals for showing mutual relation between them.

Figure 2B:
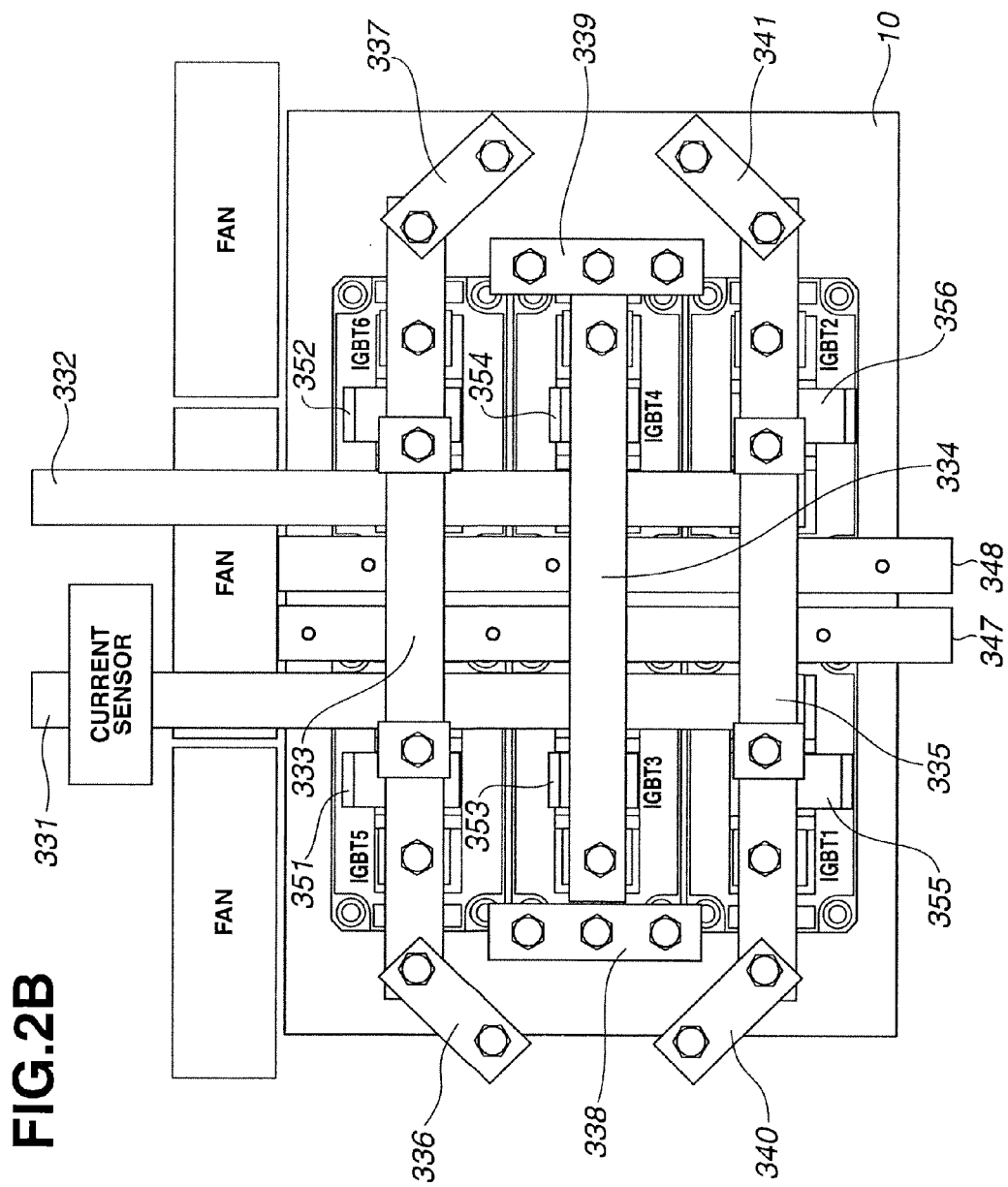
FIG. 2B is another plan view of the power converter of the embodiment of the present invention in the assembling process.
Figure 2C:
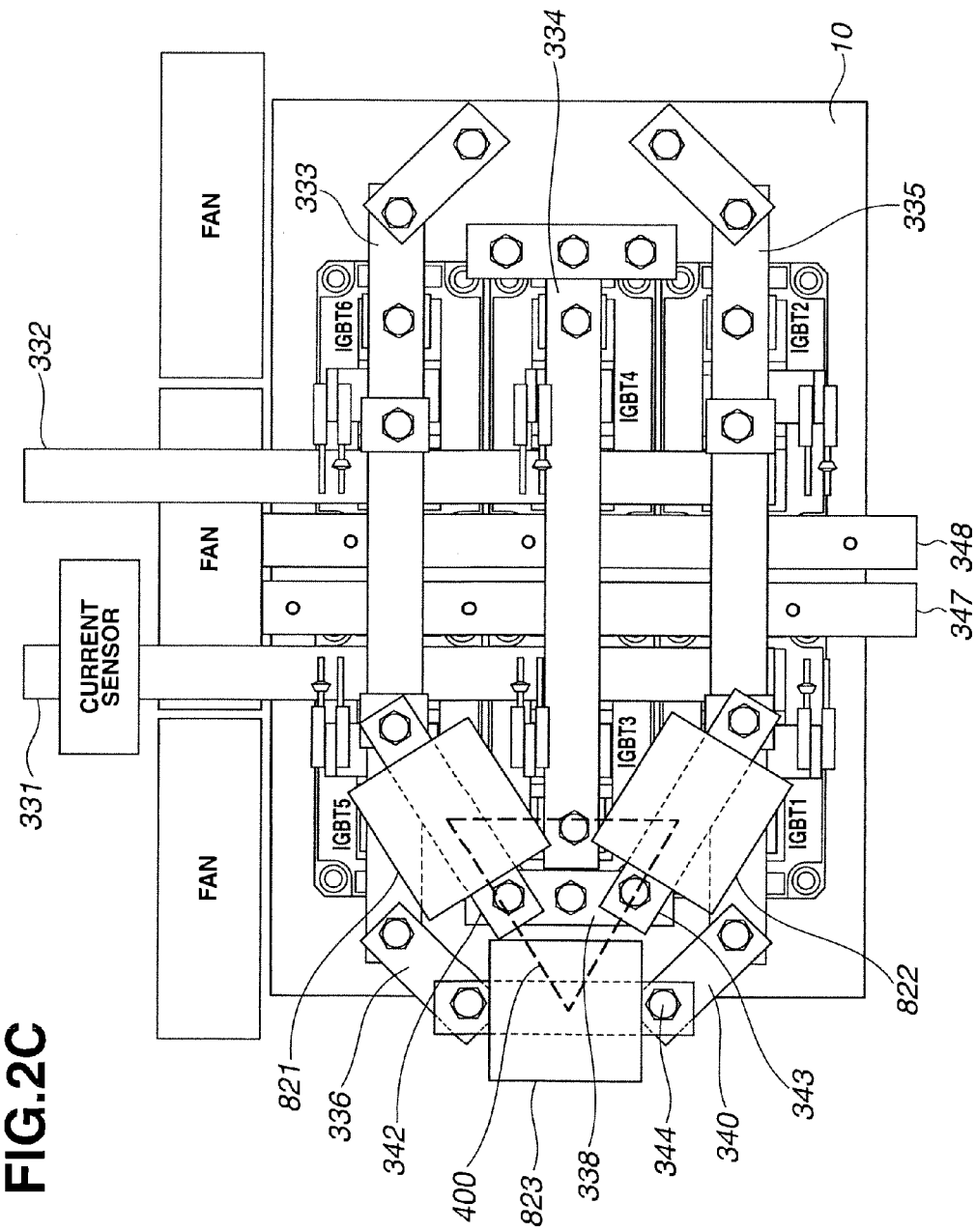
FIG. 2C is still another plan view of the power converter of the embodiment of the present invention in the assembling process.
Figure 2D:
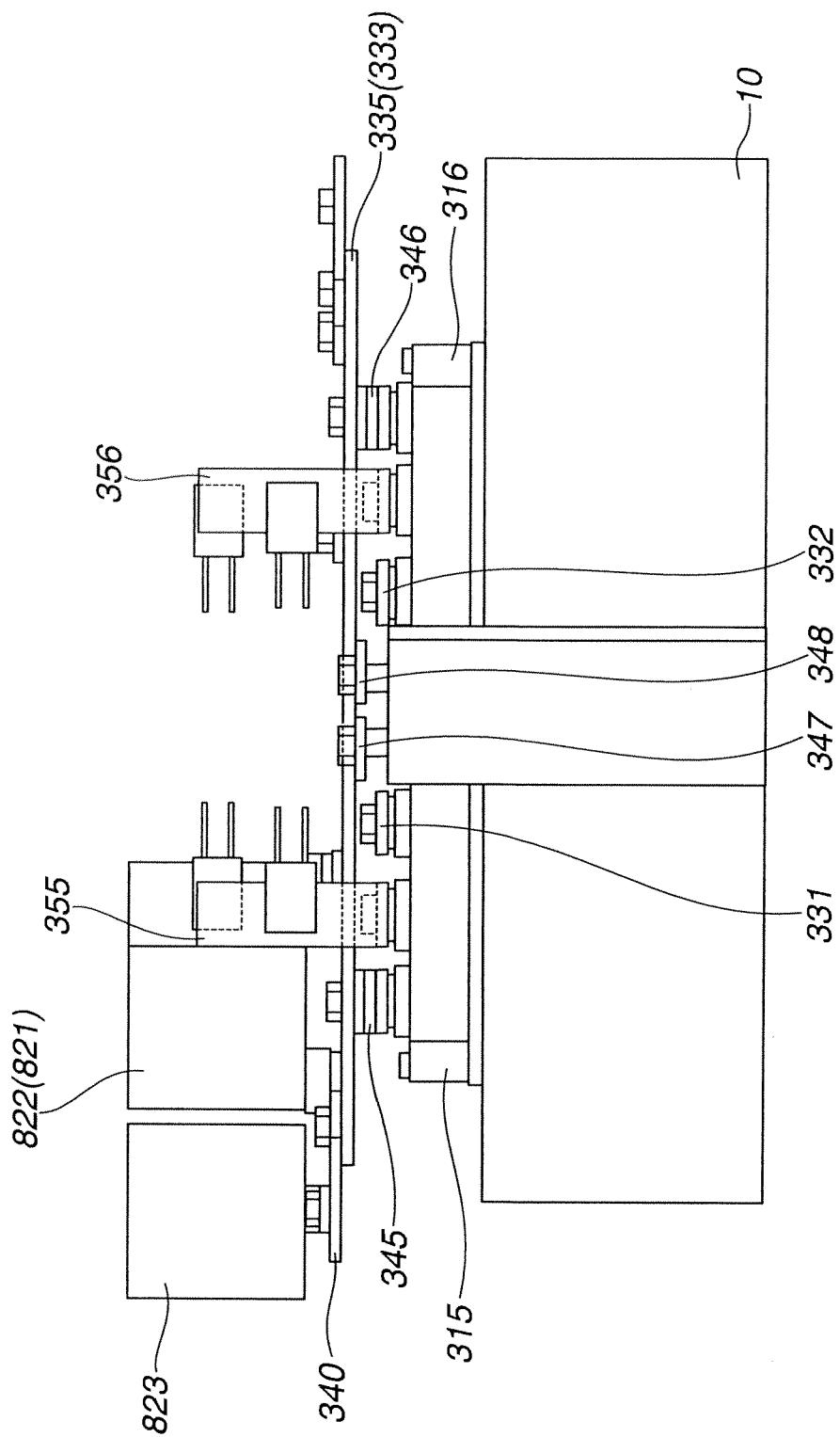
FIG. 2D is a side view of the power converter of the embodiment of the present invention in the assembling process.

FIG. 2 includes FIGS. 2A to 2D. FIG. 2A is a plan view in an assembling process showing six bidirectional switching elements 31 (each being called as IGBT module) mounted on an upper surface of a heat sink 10. FIG. 2B is a plan view in the assembling process showing, in addition to the bidirectional switching elements, bus bars that are provided to connect terminals of bidirectional switching elements 31. FIG. 2C is a plan view in the assembling process of three diodes that are parts of snubber circuit 32 and filter condensers 82 of filter circuit 8, showing the left side three filter condensers mounted. FIG. 2D is a side view of the above-mentioned device. Since parts that constitute power converter 3 of the present invention are mutually overlapped when viewed in a plane, the following explanation on essential portions will be made with the aid of the other drawings.

Figure 3:
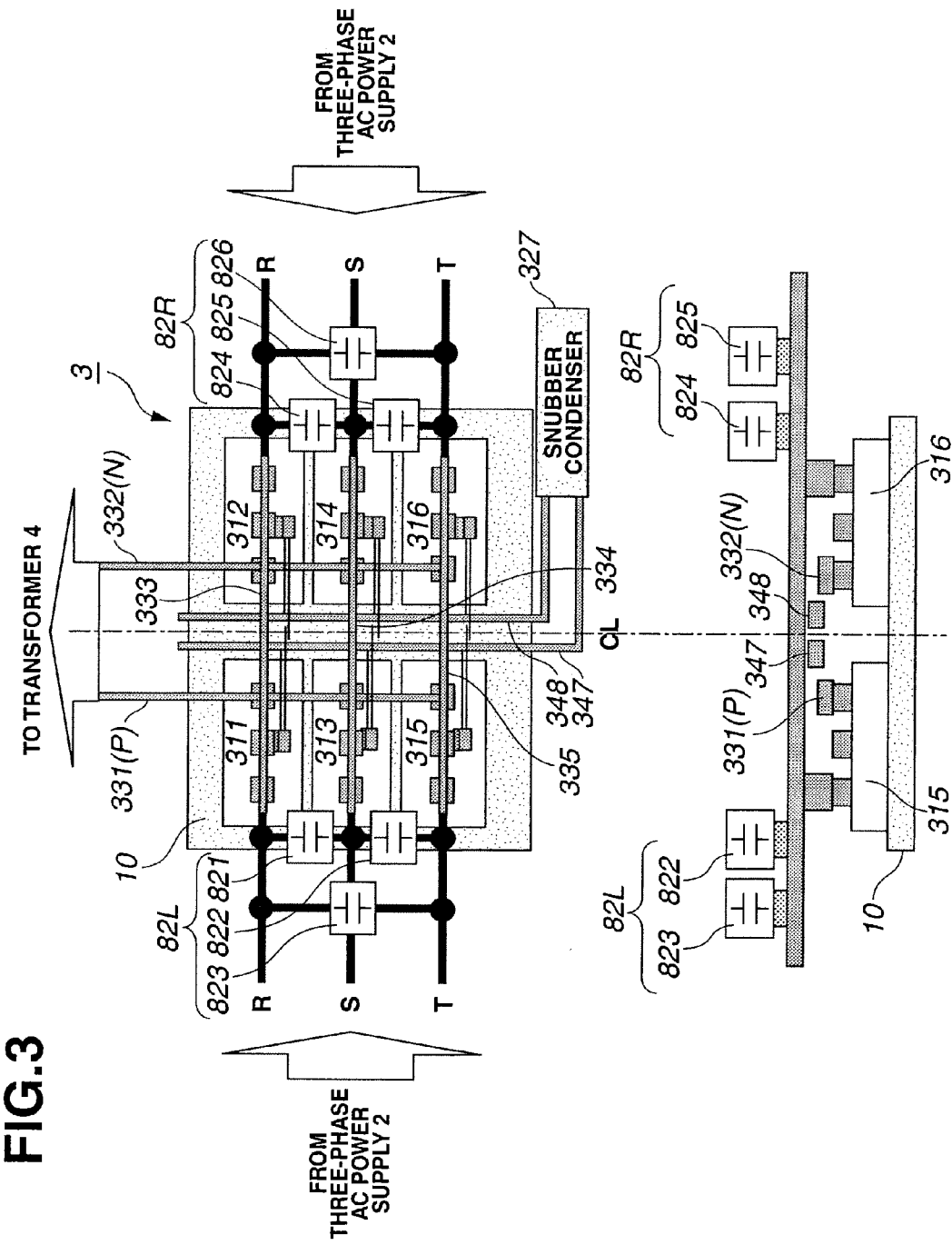
FIG. 3 shows plan and side views depicting a layout of IGBTs and filter condensers of the power converter of FIG. 2.
Figure 4A:
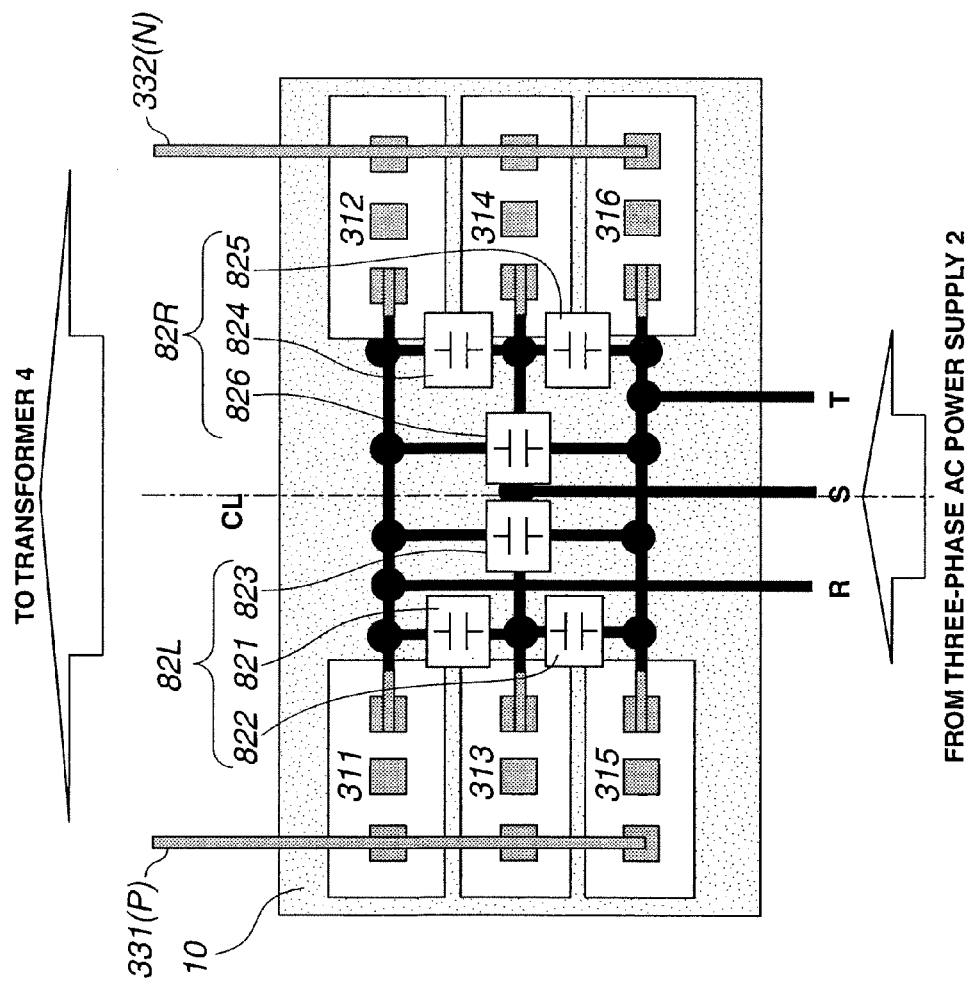
FIG. 4A is a plan view depicting another layout of IGBTs and filter condensers shown in FIG. 3.
Figure 4B:
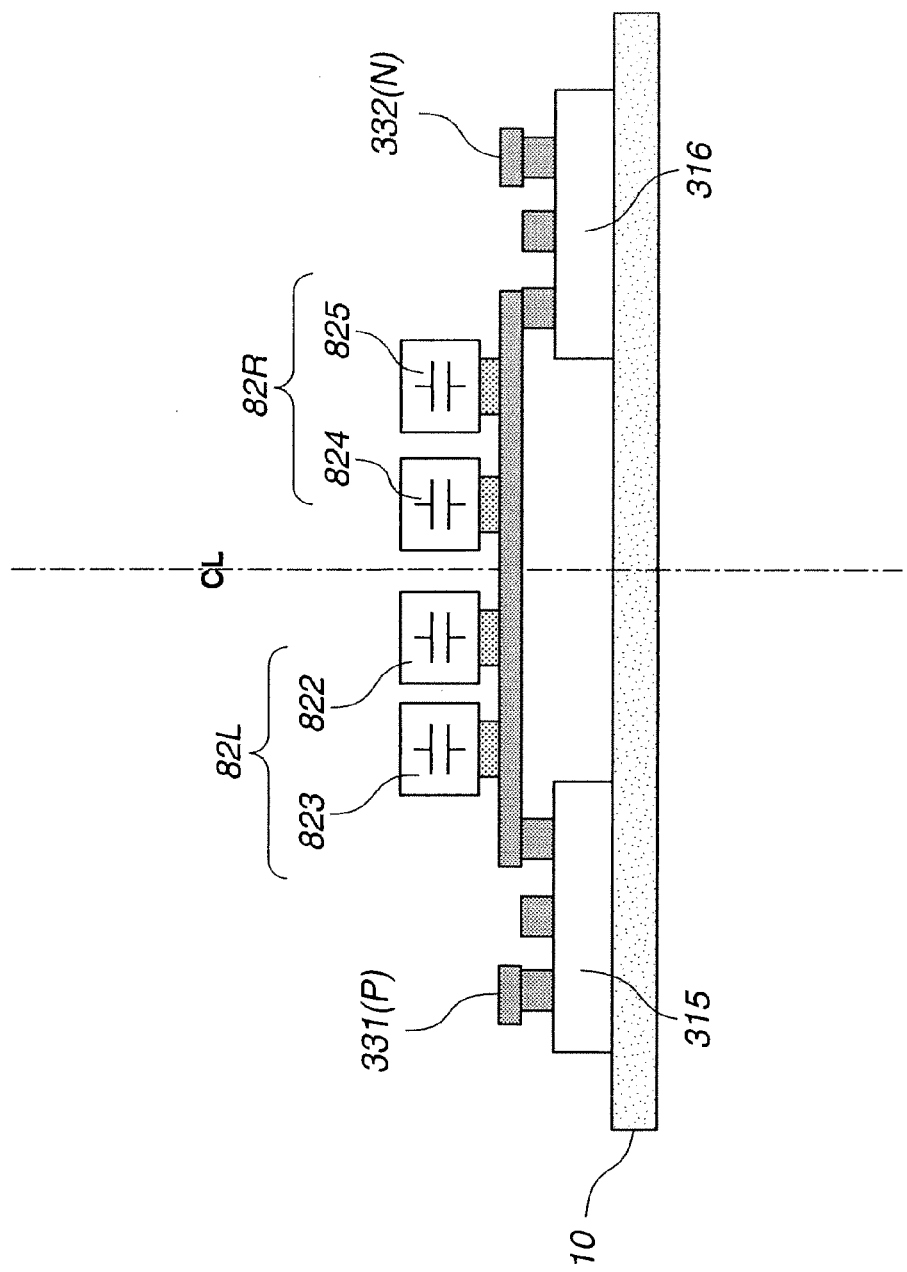
FIG. 4B is a side view of FIG. 4A.

As is shown in FIGS. 2 and 3, each bidirectional switching element 31 of this example is provided at an upper surface of a module package with input and output terminals and an intermediate terminal that is one of two intermediate terminals respectively provided by paired two IGBTs. Among the six bidirectional switching elements 311 to 316 shown in FIG. 3, the left side three bidirectional switching elements 311, 313 and 315 have each the input terminal at the left end, the output terminal at the right end and the intermediate terminal at the middle. Furthermore, among the six bidirectional switching elements 311 to 316 shown in FIG. 3, the right side three bidirectional switching elements 312, 314 and 316 have each the input terminal at the right end, the output terminal at the left end and the intermediate terminal at the middle. Although a gate terminal of each bidirectional switching element 31 is mounted to a portion other than the module package, illustration of the gate terminal is omitted.

As is seen from FIGS. 2 and 3, the six bidirectional switching elements 311 to 316 are fixed to the upper surface of heat sink 10 through connecting means such as bolts or the like. As is seen from such drawings, the six bidirectional switching elements 311 to 316 are so arranged that paired bidirectional switching elements 311 and 312, paired bidirectional switching elements 313 and 314 and paired bidirectional switching elements 315 and 316 are placed on the left and right sides respectively with respect to a center line CL. In other words, the two bidirectional switching elements 311 and 312, two bidirectional switching elements 313 and 314 and two bidirectional switching elements 315 and 316, which are each paired with respect to a direction in which the three terminals (viz., input terminal, intermediate terminal and output terminal) of each bidirectional switching element 31 extend, are respectively placed on the left and right sides with respect to the center line CL. In the following, this arrangement will be reworded as "being arranged abreast with respect to the center line CL or output lines P and N each connecting the output terminals". It is to be noted that the arrangement is different from that shown in FIG. 5 which will be described hereinafter. It is further to be noted that paired bidirectional switching elements mean a pair of bidirectional switching elements that are connected to the same phase R, S or T of input line.

By arranging paired bidirectional switching elements 311 and 312, paired bidirectional switching elements 313 and 314 and paired bidirectional switching elements 315 and 316 on the left and right sides respectively with respect to the center line CL as is described hereinabove, it is possible to provide a layout in which output lines P and N (bus bars 331 and 332) are drawn in one direction with the shortest distance. If the length of wiring arrangement through which a high frequency AC power is outputted is long, the arrangement is easily influenced by L-component. However, in the wiring arrangement according to the invention, influence by L-component can be suppressed. This suppression is an advantageous effect as compared with the arrange of the other example of FIG. 5. That is, output lines P and N show nearly straight lines until reaching transformer 4.

Furthermore, as is mentioned hereinabove, the terminals provided at right ends of bidirectional switching elements 311, 313 and 315 placed at the left side with respect to the center line CL are all output terminals, and the terminals provided at left ends of them are all input terminals. While, the terminals provided at left ends of bidirectional switching elements 312, 314 and 316 placed at the right side with respect to the center line CL are all output terminals, and the terminals provided at right ends of them are all input terminals.

To the input terminals provided at the left ends of bidirectional switching elements 311, 313 and 315 placed at the left side with respect to the center line CL, there are connected input lines R, S and T of one group branched from input lines from three-phase AC power supply 2, the input lines R, S and T of one group extending toward the center line CL, and to the input terminals provided at the right ends of bidirectional switching elements 312, 314 and 416 placed at the right side with respect to the center line CL, there are connected input lines R, S and T of the other group branched from the input lines from three-phase AC power supply 2, the input lines R, S and T of the other group extending toward the center line CL. That is, to the input terminals of bidirectional switching elements 311 and 312, there is connected R-phase, to the input terminals of bidirectional switching elements 313 and 314, there is connected S-phase and to the input terminals of bidirectional switching elements 315 and 316, there is connected T-shape. By making a direction in which the left and right input lines R, S and T extend for the connection with the input terminals equal to the direction toward the center line CL, a distance of heat sink 10 in the left-and-right direction can be reduced as compared with that of another arrangement shown in FIG. 6.

In the arrangement of FIG. 1, input lines R, S and T from three-phase AC power supply 2 to power converter 3 are branched at a position between a unit of filter reactors 81 and a unit of filter condensers 82L and 82R. However, a modification may be employed in which the branching is made at an upstream position of filter reactors 81 and the input lines R, S and T thus branched are respectively provided with filter reactors 81.

To the output terminals provided at the right ends of bidirectional switching elements 311, 313 and 315 placed at the left side with respect to the center line CL, there is connected one bus bar 331 that constitutes output line P of power converter 3, and to the output terminals provided at the left ends of bidirectional switching elements 312, 314 and 316 placed at the right side with respect to the center line CL, there is connected one bus bar 332 that constitutes output line N of power converter 3. Leading ends of these bus bars 331 and 332 are connected to transformer 4. These bus bars 331 and 332 and after-mentioned bus bars are constructed of an electrically conductive body having good conductivity, such as copper or the like.

The input terminals of paired bidirectional switching elements 311 and 312 placed at the left and right sides with respect to the center line CL are connected through a bus bar 333, the input terminals of bidirectional switching elements 313 and 314 are connected through a bus bar 334 and the input terminals of bidirectional switching elements 315 and 316 are connected through a bus bar 335. In an equivalent circuit of FIG. 1, wirings corresponding to such bus bars are indicated by the same reference numerals. In view of the function of power converter 3, these bus bars 333 to 335 are not essential. Thus, these bus bars may be omitted.

When viewed in a plan view, these bus bars 333 to 335 are arranged to cross bus bars 331 and 332 that constitute output lines P and N. However, as is seen from the side view of FIG. 3, bus bars 333 to 335 that connect the opposed input terminals are arranged at a position higher than bus bars 331 and 332 of output lines P and N, and thus a so-called overhead crossing is provided between them thereby to cause no mutual interference therebetween.

By connecting paired bidirectional switch elements 311 and 312 placed at the left and right sides with respect to the center line CL, paired bidirectional switching elements 313 and 314 and paired bidirectional switching elements 315 and 316, filter condensers 82L and 82R each being interposed between the phases can be shared with each other. That is, between R-phase and S-phase shown in the left side of FIG. 1, there is arranged a filter condenser 821, and between R-phase and S-phase shown in the right side of the drawing, there is arranged a filter condenser 824, and the input terminals of bidirectional switching elements 311 and 312 to which R-phase is inputted are connected through bus bar 333. Accordingly, noise on R-phase of three-phase AC power supply 2 is filtered by the two filter condensers 821 and 824 that cooperate with each other, and thus, each filter condenser can be made small in capacity resulting in that each filter condenser can be made small in size. Also in S-phase and T-phase, similar advantage is obtained from the cooperation of two filter condensers.

In this example, filter circuit 8 has six filter condensers 821 to 826, and as is seen from FIG. 3, the input lines placed at the left and right sides with respect to the center line CL are provided with three filter condensers respectively. The left side filter condenser 821 is disposed between R-phase corresponding to input terminal of bidirectional switching element 311 and S-phase. Like this, the left side filter condenser 822 is disposed between S-phase corresponding to the input terminal of bidirectional switching element 313 and T-phase, and the left side filter condenser 823 is disposed between T-phase corresponding to the input terminal of bidirectional switching element 315 and R-phase. While, the right side filter condenser 824 is disposed between R-phase corresponding to the input terminal of bidirectional switching element 312 and S-phase, the right side filter condenser 825 is disposed between S-phase corresponding to the input terminal of bidirectional switching element 314 and T-phase, and the right side filter condenser 826 is disposed between T-phase corresponding to the input terminal of bidirectional switching element 316 and R-phase.

As is mentioned hereinabove, by arranging, to the six bidirectional switching elements 311 to 316 which are arranged in such a manner that three elements and the other three elements are respectively placed at the left and right sides with respect to the center line CL, the six filter condensers 821 to 826 in such a manner that three condensers and the other three condensers are respectively placed at the left and right sides with respect to the center line CL, the wiring distance of connecting wiring between each of filter condensers 821 to 826 and corresponding one of bidirectional switching elements 311 to 316 can be shortened.

In this example, the six filter condensers 821 to 826 of which three filter condensers and the other three filter condensers are arranged at the left and right sides respectively are arranged outside an area where the six bidirectional switching elements 311 to 316 are placed with respect to the center line CL. Specifically, as is shown by FIG. 2D, the filter condensers are fixed to upper portions of the bus bars. By arranging filter condensers 821 to 826 outside the area of bidirectional switching elements 311 to 316, the distance in the left-right direction between the left side bidirectional switching elements 31L and the right side bidirectional switching elements 31R can be made shortest, and thus, a distance in the left-right direction of heat sink 10 can be set to the shortest resulting in that heat sink 10 can be made small in size as compared with a heat sink shown in FIG. 4A that shows the other example.

In the following, a mounting state of the filter condensers 821 to 826 which are divided into two groups (each including three filter condensers) placed on the left and right sides respectively with respect to the center line CL will be described with reference to the plan and side views of the real device of FIG. 2.

Before its description, a connecting structure of the bus bars will be described. As is seen from FIG. 2B, bus bar 331 is the output line P that connects the output terminals of bidirectional switching elements 311, 313 and 315 and leads to transformer 4, and bus bar 332 is the output line N that connects the output terminals of bidirectional switching elements 312, 314 and 316 and leads to transformer 4. Bus bar 333 is a bus bar for connecting the input terminals of bidirectional switching elements 311 and 312, and bus bar 333 has extension portions extending outward in the left and right directions from the respective input terminals and the extension portions are respectively connected to bus bars 336 and 337 for connecting to filter condensers 823 and 826 (the state of connection of these bus bars to filter condensers 823 and 826 is understood from FIGS. 2C and 3). Bus bars 336 and 337 respectively connected to opposed ends of bus bar 333 are angled relative to a line that connects the input terminals of bidirectional switching elements 311, 313 and 315, that is a line that extends in the upward-and-downward direction in FIG. 2C.

Bus bar 334 is a bus bar for connecting the input terminals of bidirectional switching elements 313 and 314, and bus bar 334 has extension portions extending outward in the left and right directions from the respective input terminals and the extension portions are respectively connected to bus bars 338 and 339 for connecting to filter condensers 821, 822, 824 and 825 (the state of connection of these bus bars to filter condensers 821, 822, 824 and 825 is understood from FIGS. 2C and 3). Bus bars 338 and 339 respectively connected to opposed ends of bus bar 334 extend along a line that connects the input terminals of bidirectional switching elements 311, 313 and 315, that is a line that extends in the upward-and-downward direction at the upper-left portion of FIG. 2.

Bus bar 335 is a bus bar for connecting the input terminals of bidirectional switching elements 315 and 316, and bus bar 335 has extension portions extending outward in the left and right directions from the respective input terminals and the extension portions are respectively connected to bus bars 340 and 341 for connecting to filter condensers 823 and 826 (the state of connection of these bus bars to filter condensers 823 and 826 is understood from FIGS. 2C and 3). Bus bars 340 and 341 respectively connected to opposed ends of bus bar 335 are angled relative to a line that connects the input terminals of bidirectional switching elements 311, 313 and 315, that is a line that extends in the upward-and-downward direction in FIG. 2C.

As is seen from FIG. 2D, these bus bars 333, 334 and 335 are connected to the input terminals of bidirectional switching elements 311 to 316 through several bus bars 345 and 346 and positioned higher than bus bars 331 and 332 that constitute output lines P and N. With this, bus bars 333 to 335 and bus bars 331 and 332 are arranged to constitute an overhead crossing therefor leaving a predetermined space therebetween, causing no mutual interference therebetween.

As is shown by broken lines in FIG. 2C, filter condensers 821, 822 and 823 are positioned outside with respect to the center line CL and arranged in such a manner that centers of filter condensers 821, 822 and 823 are respectively placed at apexes of a triangle (isosceles triangle or equilateral triangle is preferable) of which one apex is directed outward. By arranging the three filter condensers 821, 822 and 823 at the apexes of the triangle, the wiring length between the condensers can be made shortest and thus, power converter 3 can be made small in size and synchronization between the condensers can be assured. Furthermore, due to the arrangement with one apex being directed outward, the balance of wiring of the condensers is improved as compared with an arrangement in which the apex is directed inward, and distances to respective bus bars 333, 334 and 335 can be shortened.

Filter condenser 821 disposed between R-phase and S-phase is mounted on an upper surface of bus bar 342 and filter condenser 822 disposed between S-phase and T-phase is mounted on an upper surface of bus bar 343. These two bus bars 342 and 343 are connected while being angled relative to a line that connects the input terminals of bidirectional switching elements 311, 313 and 315, that is, a line that extends in the upward-and-downward direction in FIG. 2C. Furthermore, these two bus bars 342 and 343 are connected to bus bars 333, 342 and 335 while straddling a line that connects the input terminals of bidirectional switching elements 311, 313 and 315, that is a line that extends in the upward-and-downward direction in FIG. 2C. It is to be noted that filter condensers 824 and 825 mounted at the right side of the center line CL are symmetrically arranged relative to filter condensers 821 and 822 with respect to the center line CL.

By arranging bus bars 342 and 343 in such a manner that these bus bars are angled relative to the line that connects the input terminals of bidirectional switching elements 311, 313 and 315, synchronization among filter condensers 821, 822 and 823 is assured because the wiring distance between the filter condensers can be finely equalized with the wiring distance of filter condenser 823 disposed between R-phase and T-phase. Furthermore, by arranging bus bars 342 and 343 in such a manner that these bus bars straggle the line that connects the input terminals of bidirectional switching elements 311, 313 and 315, the connecting distance between filter condensers 821 and 822 and bus bars 333, 334 and 335 can be shortened, and thus, power converter 3 can be made small in size. Furthermore, by arranging filter condensers 821 to 826 on upper surfaces of the bus bars, that is, by arranging filter condensers 821 to 826 at an opposite side of bidirectional switching elements 311 to 316 with respect to the bus bars, the degree of freedom in designing layout of filter condensers 821 to 826 is increased.

Filter condenser 823 disposed between R-phase and T-phase is mounted on an upper surface of bus bar 344 disposed between bus bars 336 and 340, and bus bar 344 is arranged to extend in parallel with a line that connects the input terminals of bidirectional switching elements 311, 313 and 315.

In the following, an exemplified mounting of three diodes and one snubber condenser which constitute one snubber circuit 32 shown in FIG. 1 will be described. As is shown in FIG. 1, snubber circuit 321, for example, of bidirectional switching element 311 has one terminal connected to the input terminal of bidirectional switching terminal 311, another terminal connected to the intermediate terminal of bidirectional switching element 311 and still another terminal connected to the output terminal of bidirectional switching element 311. Accordingly, as will be understood from FIGS. 2C and 2D, the three diodes are fixed and connected to brackets 351 to 356 which are each constructed of an electrically conductive body connected to an intermediate terminal between each bidirectional switching element 31L and corresponding bidirectional switching element 31R. In FIG. 2D, only bracket 355 is shown.

In this example, a relatively large-sized electrolytic condenser is used as the snubber condenser, and the relatively large-sized electrolytic condenser is used as a common snubber condenser 327 (see FIG. 3) for the six snubber circuits 321 to 326. For connecting snubber condenser 327 and the three diodes, there are provided bus bars 347 and 348 that are placed between bus bars 331 and 332 and extend in the same direction as these bus bars 331 and 332, the bus bars 331 and 332 constituting the output lines P and N.

As is seen from FIGS. 2D and 3, the two bus bars 347 and 348 connected to snubber condenser 327 are fixed to a position that is higher than bus bars 331 and 332 that constitute the output lines P and N but lower than bus bars 333, 334 and 335. It is to be noted that these two bus bars 347 and 348 are supported on heat sink 10 or a base (not shown) other than the heat sink. For preventing a short-circuit with bus bars 333, 334 and 335, outer surfaces of bus bars 347 and 348 may be coated with an insulating material.

Arrangement of bus bars 347 and 348 with respect to bus bars 331 and 332 that constitute output lines P and N and snubber condenser 327 is as follows. That is, by arranging bus bars 347 and 348 between bus bars 331 and 332, both the wiring distance to output lines P and N and the wiring distance to snubber condenser 327 can be shortened. Furthermore, by arranging bus bars 347 and 348 higher than bus bars 331 and 332, it is possible to shorten the distance from the diodes of each of snubber circuits 321 to 326.

According to the above-mentioned embodiment, the following advantages are obtained.

1) In this example, to the six bidirectional switching elements 311 to 316 which are arranged in such a manner that three elements and the other three elements are respectively placed at the left and right sides with respect to the center line CL, there are arranged the six filter condensers 821 to 825 in such a manner that three condensers and the other three condensers are respectively placed at the left and right sides with respect to the center line CL, so that the wiring distance of connecting wiring between each of filter condensers 821 to 823 and corresponding one of bidirectional switching elements 311 to 316 can be shortened.

2) In this example, since paired bidirectional switching elements 311 and 312, paired bidirectional switching elements 313 and 314 and paired bidirectional switching elements 315 and 316 are each arranged at the left and right sides respectively with respect to the center line CL, it is possible to provide a layout in which output lines P and N (viz., bus bars 331 and 332) are drawn in one direction with the shortest distance. If the length of wiring arrangement through which a high frequency AC power is outputted is long, the arrangement is easily influenced by L-component. However, in the wiring arrangement according to the invention, influence by L-component can be suppressed.

3) In this example, the six filter condensers 821 to 826 of which three filter condensers and the other three filter condensers are arranged at the left and right sides respectively are arranged outside an area where the six bidirectional switching elements 311 to 316 are placed with respect to the center line CL. Thus, the distance in the left-and-right direction between the left side bidirectional switching elements 31L and the right side bidirectional switching elements 31R can be made shortest. Accordingly, the distance in the left-and-right direction of heat sink 10 can be set to the shortest resulting in that heat sink 10 can be reduced in size.

4) In this example, the input terminals of paired bidirectional switching elements 311 and 312, the input terminals of paired bidirectional switching elements 313 and 314 and the input terminals of paired bidirectional switching elements 315 and 316, which are arranged at the left and right sides with respect to the center line CL, are connected through respective bus bars 333, 334 and 335. Accordingly, filter condensers 82L and 82R each being disposed between the phases can be shared. Thus, each filter condenser can be made small in capacity resulting in that each filter condenser can be made small in size.

5) In this example, since the direction in which the left and right input lines R, S and T extend for the connection with the bidirectional switching elements 31L and 31R, is made equal to the direction toward the center line CL, a distance of heat sink 10 in the left-and-right direction can be made small.

6) In this example, filter condensers 821 to 826 are arranged on upper surfaces of the bus bars, that is, filter condensers 821 to 826 are arranged at an opposite side of bidirectional switching elements 311 to 316 with respect to the bus bars, the degree of freedom in designing layout of filter condensers 821 to 826 is increased.

7) In this example, the arrangement of bus bars 347 and 348 relative to bus bars 331 and 332 that constitute output lines P and N and snubber condenser 327 is so made that bus bars 347 and 348 are placed between bus bars 331 and 332, so that both the wiring distance to output lines P and N and the wiring distance to snubber condenser 327 are shortened.

8) In this example, since bus bars 347 and 348 are arranged higher than bus bars 331 and 332, it is possible to shorten the distance from the diodes of each of snubber circuits 321 to 326.

9) In this example, since the three filter condensers 821, 822 and 823 are arranged at the apexes of the triangle, the wiring length between the condensers can be made shortest and thus, power converter 3 can be made small in size, and synchronization between the condensers can be assured.

10) In this example, since an apex of the triangle at which one of the three filter condensers is arranged is directed outward, the balance of wiring of the condensers is improved as compared with an arrangement in which the apex is directed inward and the distances to bus bars 333, 334 and 335 can be shortened.

11) In this example, since bus bars 342 and 343 are arranged to be angled relative to the line that connects the input terminals of bidirectional switching elements 311, 313 and 315, the wiring distance between the filter condensers can be finely equalized with the wiring distance of filter condenser 823 disposed between R-phase and T-phase. Accordingly, synchronization among filter condensers 821, 822 and 823 can be assured.

12) In this example, since bus bars 342 and 343 are arranged to straggle the line that connects the input terminals of bidirectional switching elements 311, 313 and 315, the connecting distance between filter condensers 821 and 822 and bus bars 333, 334 and 335 can be shortened, and thus, power converter 3 can be made small in size.

Other Embodiments

The present invention has modifications and embodiments other than the above-mentioned embodiment. In the following, modifications of the invention will be described. The present invention is not limited to the above-mentioned embodiment and the following embodiments. In the following, parts identical to those described in the above-mentioned embodiment are indicated by the same reference numerals and explanation on the same parts will be suitably omitted.

In the above-mentioned embodiment, as is shown in FIG. 3, the three left side filter condensers 82L and the three right side filter condensers 82R are arranged outside an area of bidirectional switching elements 311, 313 and 315 and an area of bidirectional switching elements 312, 314 and 316 respectively with respect to the center line CL. However, as is seen from FIGS. 4A and 4B, the three left side filter condensers and the three right side condensers may be arranged between an area of the left side bidirectional switching elements 311, 313 and 315 and an area of the right side bidirectional switching elements 312, 314 and 316 with respect to the center line CL.

In the above-mentioned embodiment, as is shown in FIG. 3, the six bidirectional switching elements 311 to 316 are so arranged that bidirectional switching elements 311, 313 and 315 and bidirectional switching elements 312, 314 and 316 are arranged at the left and right sides respectively with respect to the center line CL. However, as is shown in FIG. 5, bidirectional switching elements 311, 313 and 315 and bidirectional switching elements 312, 314 and 316 may be arranged along the center line CL.

Figure 6:
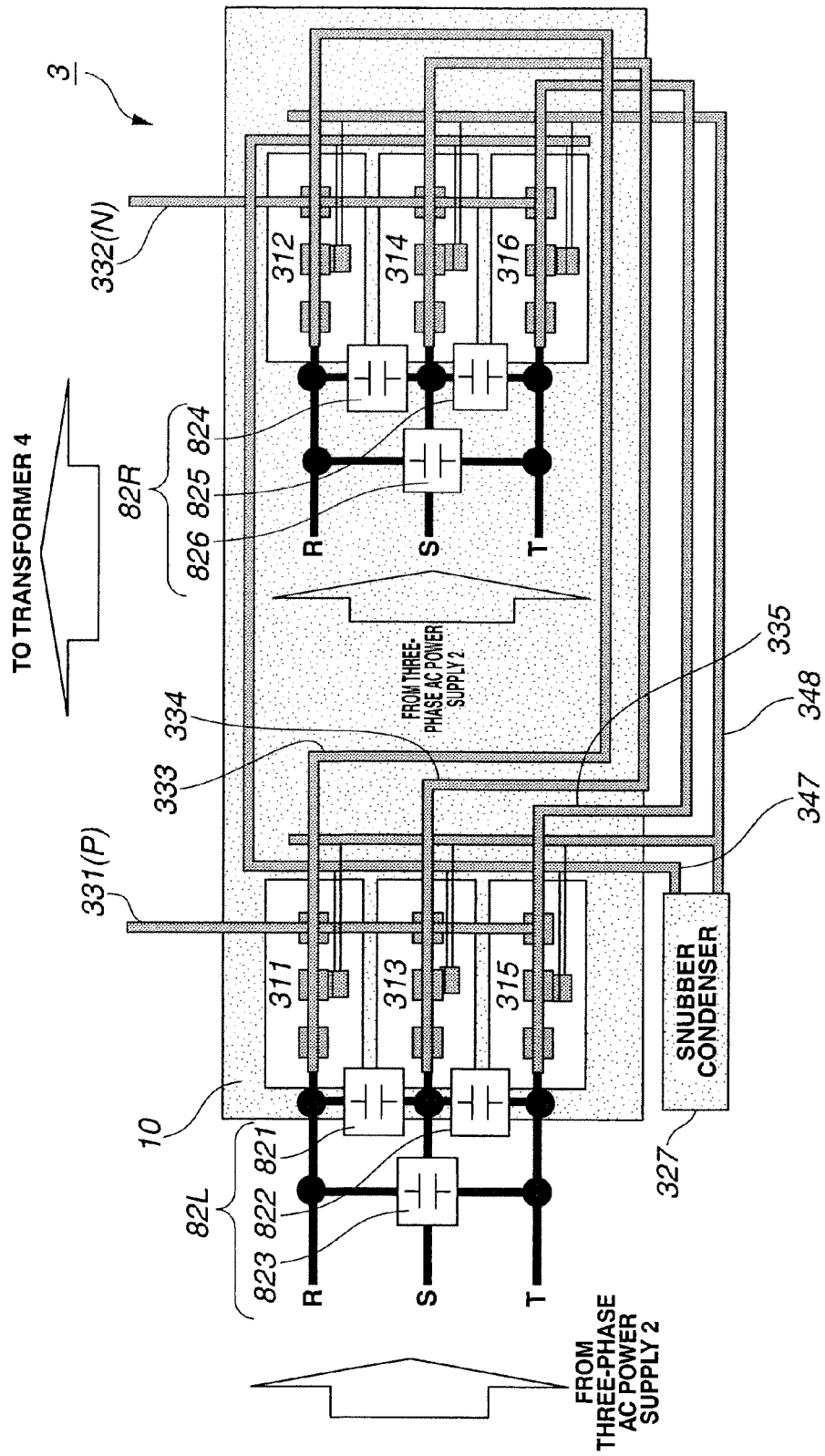
FIG. 6 shows plan and side views depicting another layout of IGBTs and filter condensers shown in FIG. 3.

In the above-mentioned embodiment, as is shown in FIG. 3, the six bidirectional switching elements 311 to 316 are so arranged that bidirectional switching elements 311, 313 and 315 and bidirectional switching elements 312, 314 and 316 are arranged at the left and right sides respectively with respect to the center line CL and the input and output terminals of the left side bidirectional switching elements and the input and output terminals of the right side bidirectional switching elements are arranged in line symmetry with respect to the center line CL. However, as is shown in FIG. 6, an arrangement may be employed in which bidirectional switching elements 311, 313 and 315 and bidirectional switching elements 312, 314 and 316 are arranged at the left and right sides with respect to the center line CL and the input and output terminals of the left side bidirectional switching elements and the input and output terminals of the right side bidirectional switching elements are arranged in the same manner. In this case, input lines R, S and T of the dual system are connected to the input terminals of the left and right side bidirectional switching elements while extending in the same direction (in the direction from left to right in the illustrated example).

Figure 7:
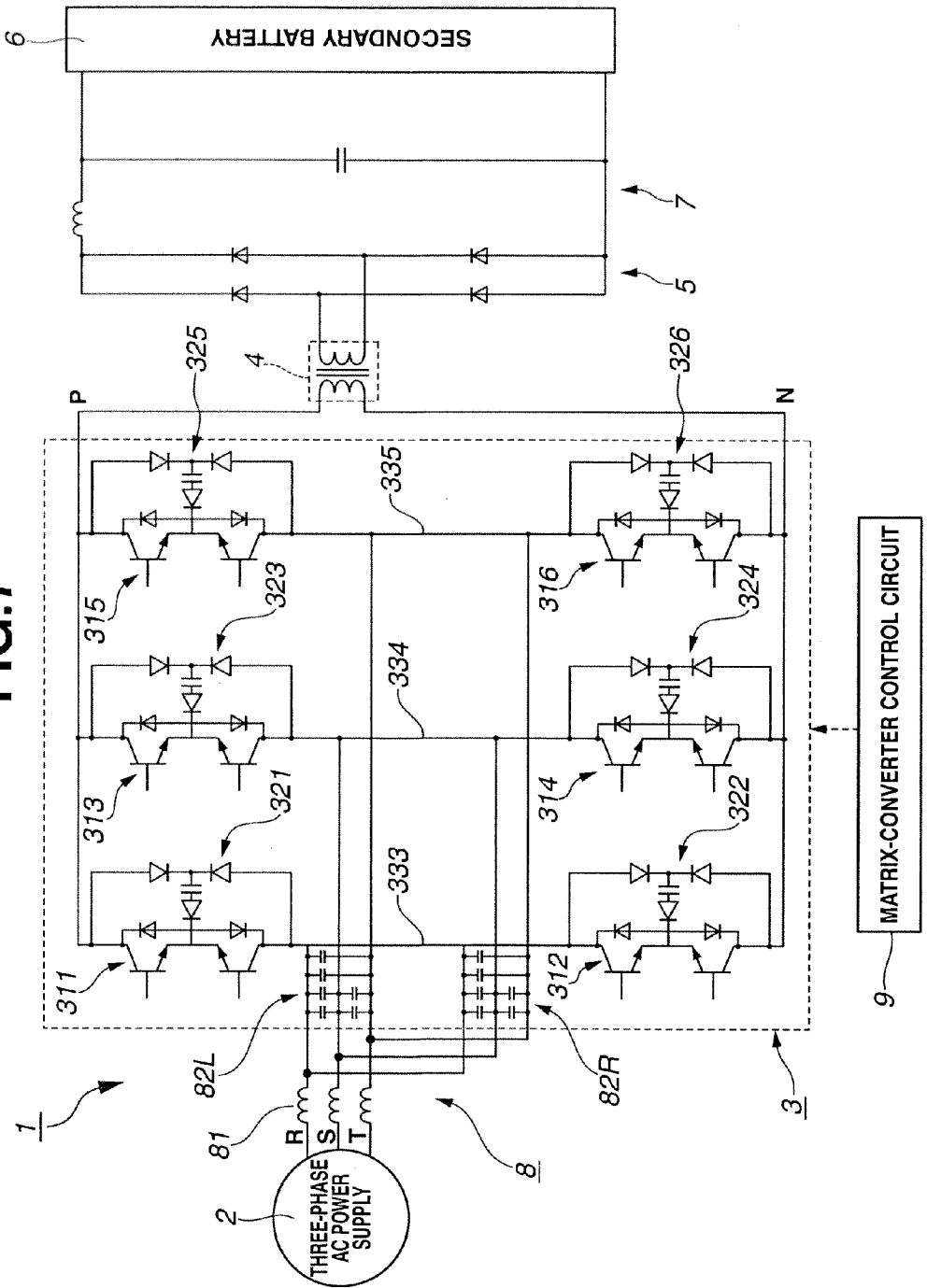
FIG. 7 is an electrical diagram showing a power conversion system to which another embodiment of the present invention is practically applied.

In the above-mentioned embodiment, as is shown in FIG. 3, filter condensers 821 to 826 are arranged between the phases while keeping one-to-one relation to the six bidirectional switching elements 311 to 316. However, as is shown in FIG. 7, an arrangement may be employed in which filter condensers 821 to 826 are arranged between the phases in such a manner that several (two in the illustrated example) of the filter condensers 821 to 826 are connected to each of the six bidirectional switching elements 311 to 316.

Figure 8:
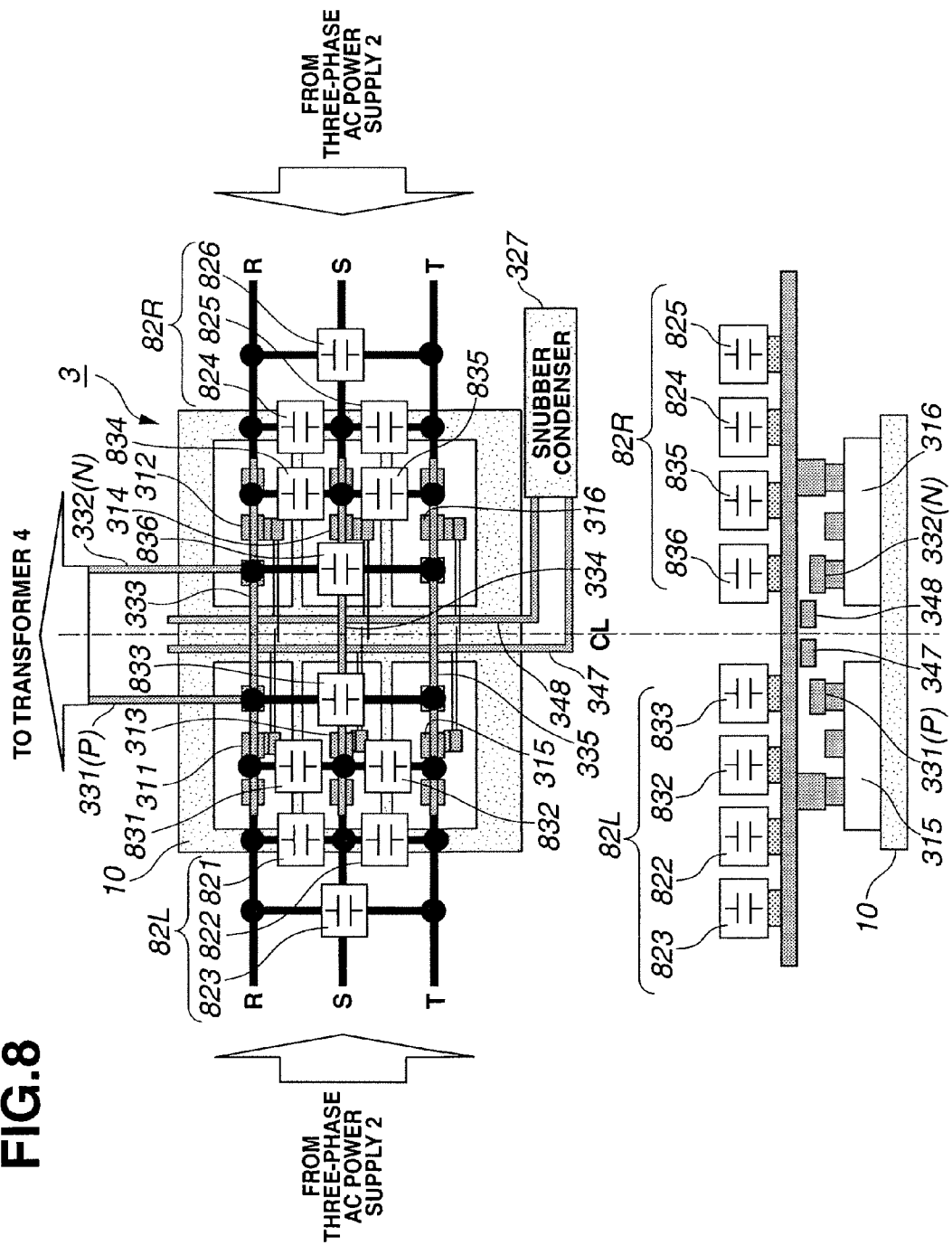
FIG. 8 shows plan and side views depicting a layout of IGBTs and filter condensers of the power converter of FIG. 7.
Figure 9:
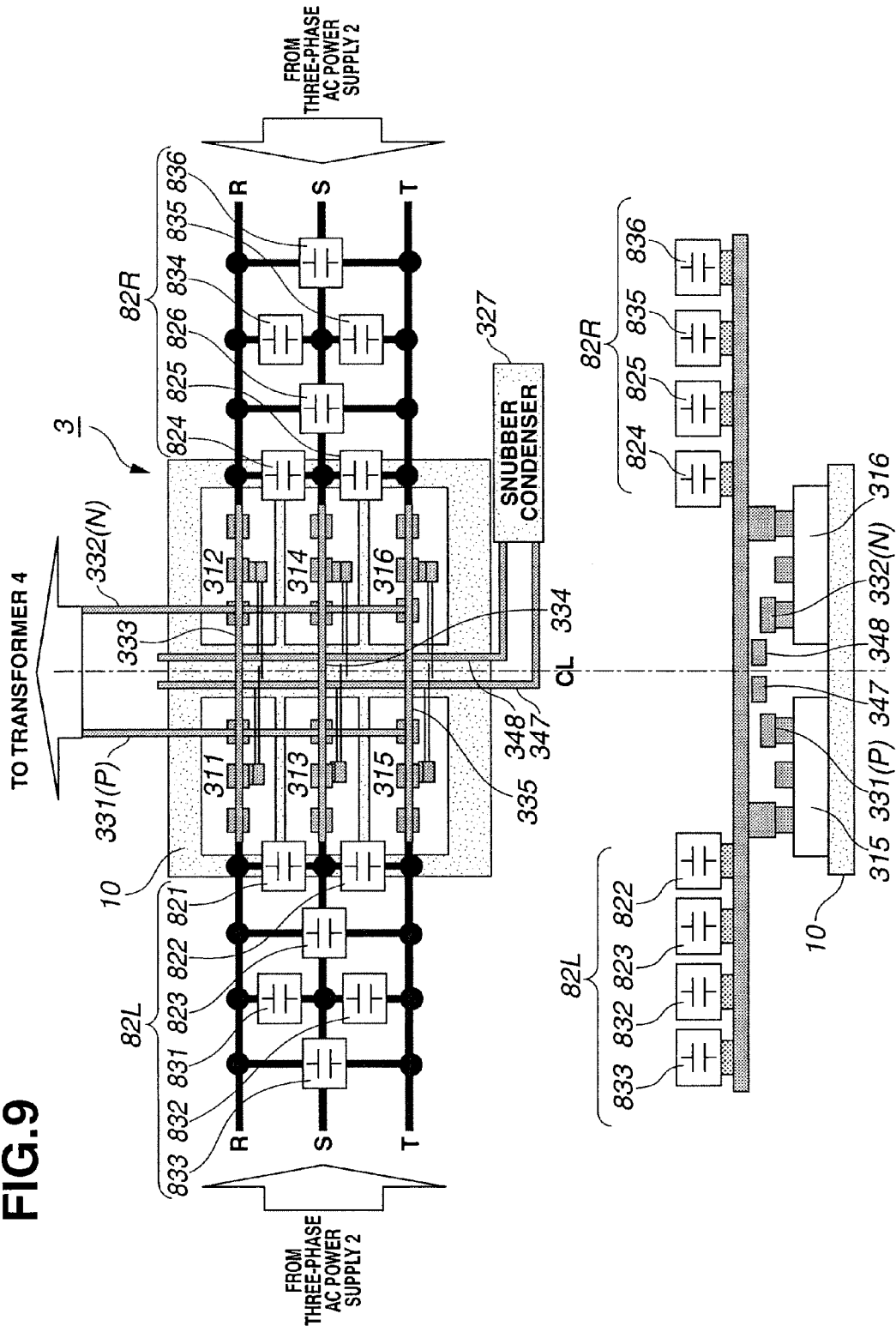
FIG. 9 shows plan and side views depicting another layout of IGBTs and filter condensers of the power converter of FIG. 7.

In this case, the filter condensers may be arranged at the center of power converter 3 as is shown in FIG. 8 or outside power converter 3 as is shown in FIG. 9. As will be understood from FIG. 8, when the filter condensers are arranged at the center of power converter 3, empty spaces are usable, so that the size of power converter 3 can be made as small as possible.

The above-mentioned bidirectional switching elements 311, 313 and 315 correspond to first switching elements in Claims, the above-mentioned bidirectional switching elements 312, 314 and 316 correspond to second switching elements in Claims, the above-mentioned power converter 3 corresponds to a converter circuit in Claims, the above-mentioned bus bars 347 and 348 correspond to parts of wiring of a protection circuit in Claims, and the above-mentioned bus bars 331 and 332 correspond to output lines in Claims.

The invention claimed is:

1. A power converter that directly converts polyphase AC power to AC power, the power converter comprising:
   a converter circuit including a plurality of first switching elements that are connected to phases of the polyphase AC power to enable switching for turning on current-carrying bidirectionally and a plurality of second switching elements that are connected to the phases of the polyphase AC power to enable switching for turning on current-carrying bidirectionally;
   a plurality of input lines connected to input terminals of the plurality of first switching elements and input terminals of the plurality of second switching elements respectively;
   a first output line connected to output terminals of the plurality of first switching elements and a second output line connected to output terminals of the plurality of second switching elements; and
   protection circuits that are respectively connected to the first switching elements and second switching elements,
   wherein the power converter has components arranged in a physical arrangement as follows:
   physical positions of the output terminals of the plurality of first switching elements are physically arranged in a line and physical positions of the output terminals of the plurality of second switching elements are physically arranged in a line;
   in a plan view, physical positions of the plurality of first switching elements are physically arranged in a first line and the plurality of second switching elements are physically arranged in a second line, such that the first line and the second line are parallel with the first and second output lines; and
   physical positions of parts of wiring of the protection circuits are physically arranged between (1) the physical positions of the first switching elements and (2) the physical positions of the second switching elements.

2. The power converter as claimed in claim 1, in which the protection circuits respectively provided by the first switching elements and the second switching elements have each diodes that are included in each protection circuit and a condenser that is commonly used in the protection circuits, and in which the parts of wiring of the protection circuits are wirings each of which connects the diodes to the condenser.

3. The power converter as claimed in claim 2, in which a physical position of the wiring that connects the condenser and diodes is higher than a physical position of the first and second output lines.

4. The power converter as claimed in claim 1, in which the parts of wiring of the protection circuits are straight bus bars and physical positions of the straight bus bars are physically arranged between physical positions of a pair of bus bars that constitute the first and second output lines.

5. The power converter as claimed in claim 4, in which the straight bus bars that constitute the parts of wiring of protection circuits and the pair of bus bars that constitute the first and second output lines physically extend in parallel with each other.

6. The power converter as claimed in claim 1, further comprising:

a common condenser connected to each of the first switching elements and second switching elements via particular wiring including at least one straight bus bar,
wherein the at least one straight bus bar is physically arranged between (1) the physical positions of the first switching elements and (2) the physical positions of the second switching elements.

\* \* \* \* \*